United States Patent [19]
Sato et al.

[11] Patent Number: 5,146,573
[45] Date of Patent: Sep. 8, 1992

[54] SINGLE CHIP CACHE WITH PARTIAL-WRITE CIRCUIT FOR TRANSFERRING A PRESELECTED PORTION OF DATA BETWEEN MEMORY AND BUFFER REGISTER

[75] Inventors: Katsuyuki Sato, Akishima; Tadahiko Nishimukai, Sagamihara; Kunio Uchiyama; Hirokazu Aoki, both of Hachioji; Susumu Hatano, Musashino; Kanji Oishi, Koganei; Hiroshi Fukuta, Kodaira; Takashi Kikuchi, Akishima; Yasuhiko Saigou, Fuchuu, all of Japan

[73] Assignees: Hitachi, Ltd.; Hitachi VLSI Engineering Corp., both of Tokyo, Japan

[21] Appl. No.: 426,781

[22] Filed: Oct. 25, 1989

[30] Foreign Application Priority Data

Nov. 1, 1988 [JP] Japan .................. 63-277624
Dec. 26, 1988 [JP] Japan .................. 63-330040

[51] Int. Cl.$^5$ .................. G06F 13/14; G06F 12/02
[52] U.S. Cl. .................. 395/425; 364/DIG. 1; 364/238.6; 364/239.8; 364/247.8; 364/260.3; 364/282.3; 364/284.1
[58] Field of Search ... 364/200 MS File, 900 MS File

[56] References Cited

U.S. PATENT DOCUMENTS

| | | | |
|---|---|---|---|
| 3,820,078 | 6/1974 | Curley et al. | 364/200 |
| 3,938,097 | 2/1976 | Niguette, III | 364/200 |
| 4,268,907 | 5/1981 | Porter et al. | 364/200 |
| 4,370,710 | 1/1983 | Kroft | 364/200 |
| 4,493,026 | 1/1985 | Olnowich | 395/425 |
| 4,797,813 | 1/1989 | Igarashi | 364/200 |
| 4,833,642 | 5/1989 | Ooi | 365/49 |
| 4,905,188 | 2/1990 | Chuang et al. | 364/900 |
| 4,914,582 | 4/1990 | Bryg et al. | 395/425 |
| 4,920,478 | 4/1990 | Furuya et al. | 364/200 |
| 4,970,643 | 11/1990 | Cramm | 395/400 |

OTHER PUBLICATIONS

David A. Patterson, et al., "Computer Architecture A Quantitative Approach", 1990, pp. 403-425 and 454-474, (Provided in English).
Nikkei Electronics, published by Nikkei-McGraw-Hill, Inc., Nov. 16, 1987, pp. 170-171, English translation provided.

*Primary Examiner*—Thomas C. Lee
*Assistant Examiner*—Krisna Lim
*Attorney, Agent, or Firm*—Fay, Sharpe, Beall, Fagan, Minnich & McKee

[57] ABSTRACT

In a cache memory setup, a buffer register is provided to accommodate the data read from a data memory. Between the buffer register and the data memory is connected a selector. This selector selectively transfers to the buffer register part of the data read from the data memory. The remaining part of the data is replaced with appropriate data for transfer to the buffer register. This arrangement provides the cache memory with a partial-write function.

8 Claims, 5 Drawing Sheets

SINGLE CHIP CACHE WITH PARTIAL-WRITE CIRCUIT FOR TRANSFERRING A PRESELECTED PORTION OF DATA BETWEEN MEMORY AND BUFFER REGISTER

BACKGROUND OF THE INVENTION

The present invention relates to a buffer storage device based on storage management techniques and, more particularly, to a buffer storage device adapted to provide a cache memory in an information processing system typically operating on the buffer storage principle.

Some prior art microcomputers operating on the buffer storage principle have used a cache memory accommodating frequently used data items taken from the main memory (composed of dynamic RAM, etc.). A storage management unit known as a cache controller is used to control cache memory operations so as to improve the throughput of such microcomputers.

The cache memory is accessed by a microprocessor unit (MPU) using its output of a logical address. When desired data is found in the cache memory, which is an operation called a hit, the MPU immediately obtains the data therefrom. Thus the arrangement helps improve the system throughput.

The cache controller takes the address output from the MPU and compares it with another, internally held address called a tag. If it is judged upon comparison that the required data is not found in the cache memory, a "miss" signal is output. In response, the MPU gains access to the main memory to obtain the data ("Nikkei Electronics," pp. 170–171; Nov. 16, 1987 issue; Nikkei-McGraw-Hill, Inc.)

A majority of memory systems operating on an error-correcting principle called the ECC (error-correcting code) method usually generate an ECC for each one-word data item (4 bytes long). This is now generally the case as 32-bit MPU's have gained widespread acceptance. As a result of this, data is most often transferred between cache memory and main memory in words.

There are two kinds of cache memory system: a write-through system and a copy-back system. The write-through system involves, when the MPU writes data to the cache memory, having the main memory correspondingly updated immediately after a data array write operation. With the copy-back system, the main memory is updated upon block replacement.

In addition, prior art cache memories have not been equipped with the so-called partial-write function. This is a function that updates only one byte of data inside the cache memory as desired.

SUMMARY OF THE INVENTION

To bypass the major constraints of conventional cache memory features, we looked for the possibility of having a cache memory equipped with the partial-write function. In the setup we used, one-word data was read from the data array and into a one-word register (or buffer). Then a control signal called a byte code was provided. A particular byte of the data in the one-word register was selected and updated. At the same time, the one-word data was transferred from the register both to the data array and to a main memory located outside the setup. This made it possible to implement the partial-write function in a write-through cache memory system.

However, the above-described system required executing three cycles to complete a partial-write operation: (1) reading one-word data, (2) updating the selected byte, and (3) writing the data to the data array and main memory. Consequently, it took time to update the data.

With the above results taken into account, it is a first object of the present invention to provide a high-performance, high-speed cache memory by equipping the cache memory with a partial-write function that substantially reduces the time required to complete a partial-write operation.

Prior art cache memories had another constraint. If a block to be removed from the cache memory contains even a single data item that was updated, the entire block must be transferred to the main memory. All the unnecessary data that must be transferred along with the single updated data item reduces the throughput of the memory bus. In addition, while the data is being transferred from cache memory to main memory, the MPU is barred from accessing the cache memory. This reduces the throughput of the MPU bus. We also found that the larger the data unit for block transfer between cache memory and main memory, the lower the bus throughput.

It is therefore a second object of the present invention to provide a high-throughput memory bus and MPU bus in a buffer storage system using a copy-back cache memory arrangement.

The above and other related objects and features of the invention will be apparent from a reading of the following description of the disclosure found in the accompanying drawings and the novelty thereof pointed out in the appended claims.

A typical construction for achieving the first object of the invention described above will now be outlined. A full-write register is provided to accommodate 32-bit data taken from the data array in the cache memory. This full-write register is connected to the data array via a gate arrangement. A selector is provided between the full-write register on the one hand, and a write buffer which holds write data and an internal bus arrangement on the other. The gate and selector circuit is controlled in accordance with a byte control signal coming from the MPU. The section is controlled so that the data to be written in bytes and the three-byte data not subject to partial write operations in the data array are placed simultaneously in the full-write register. In the state thus controlled, the updated 32-bit data in the full-write register is then transferred, in accordance with a hit signal coming from a tag comparator, both to the data array and to an external memory.

By use of the above-described means, data is read from the data array while the byte data subject to a partial write operation is being placed simultaneously in the full-write register. This means that a partial-write operation in the data array can be accomplished in two cycles, not three.

There will now be outlined a typical construction for achieving the second object of the invention described above. In an address array used as a directory memory, there is provided a bit string which indicates whether or not any data in the data array has been updated in accordance with a tag in the address array. When a "miss" operation is detected and the block determined by an LRU algorithm is to be transferred accordingly to the main memory, the bit string is referenced so that only the updated data is selected and subjected to the transfer.

By use of the above-described means, the bit string indicates the updates in words, not in blocks as has been the case with prior art arrangements. This eliminates the need to output the data not updated to the outside. It follows that the throughput of the memory bus and MPU bus is improved appreciably.

BRIEF DESCRIPTION OF THE DRAWINGS

FIG. 6 is a diagram showing a configuration of a directory memory along with its peripheral circuits having a flag bit string which indicates whether any of the data in a data memory has been updated.

DESCRIPTION OF THE PREFERRED EMBODIMENTS

Figure 1:
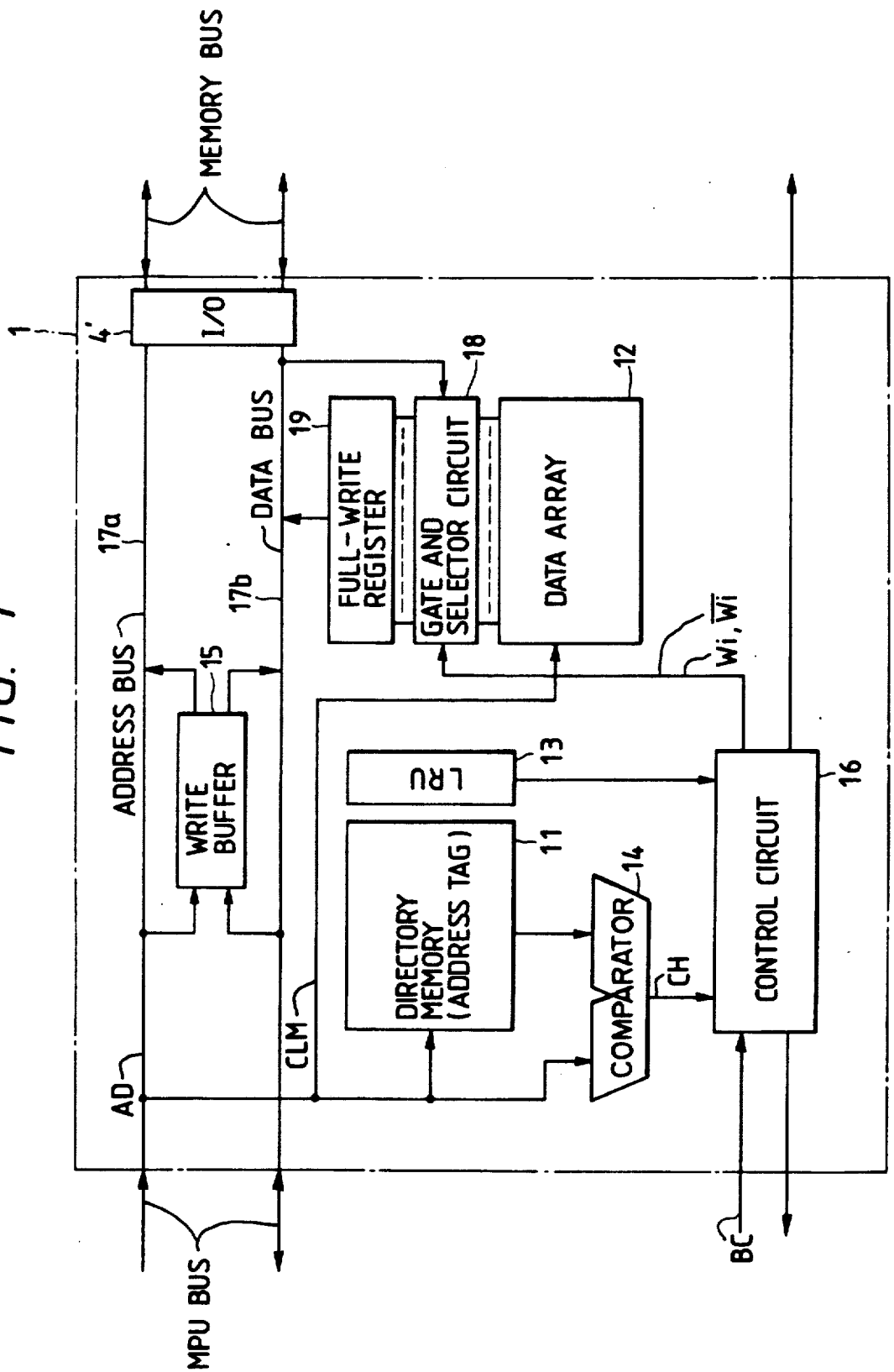
FIG. 1 is a block diagram of a first embodiment of the invention as a cache memory.
Figure 2:
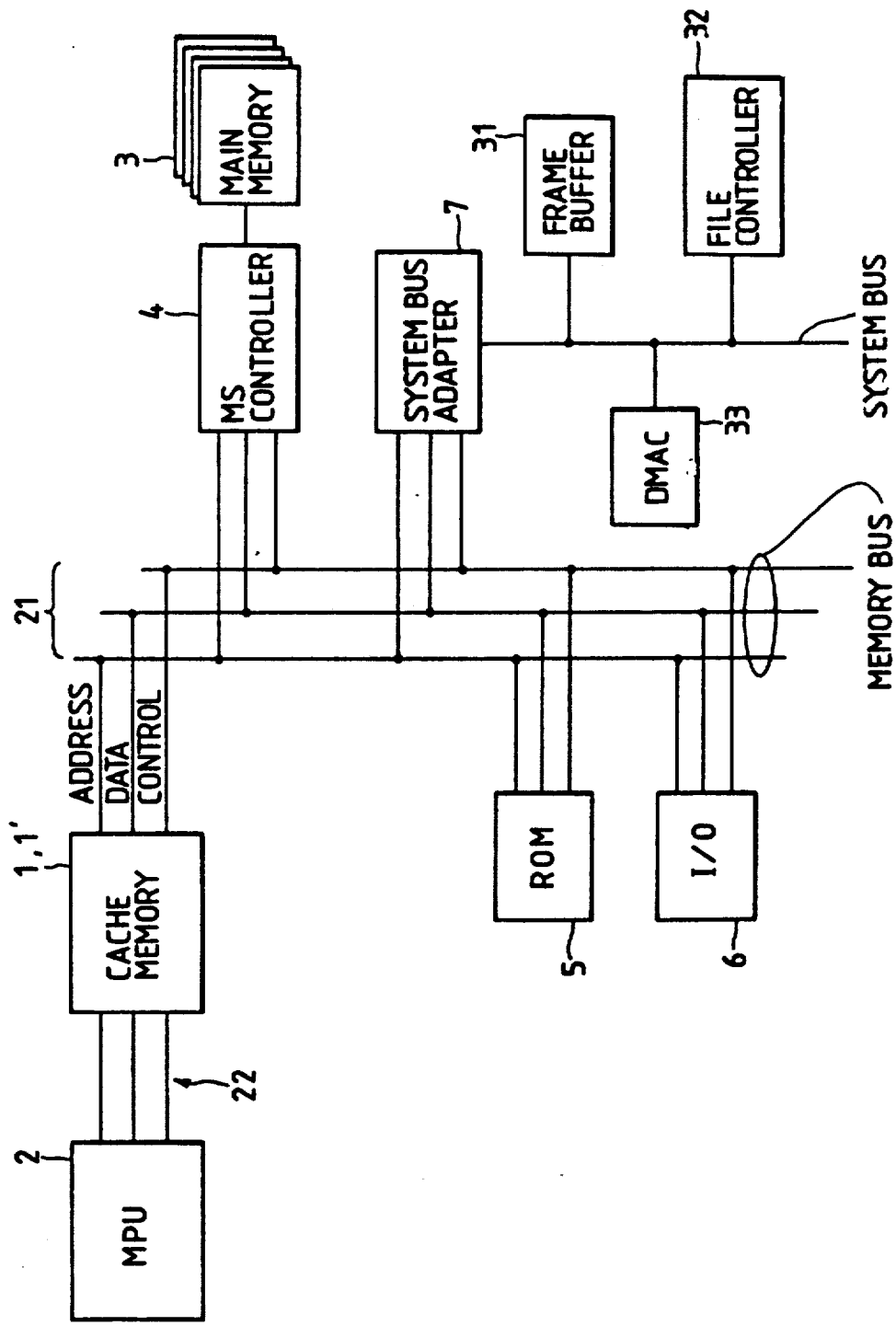
FIG. 2 is a system configuration diagram showing how a microprocessor system is configured using the cache memory according to the invention.

FIG. 1 depicts in a block diagram the first embodiment of the invention as a cache memory in a cache controller, and FIG. 2 illustrates how a microprocessor system using this cache memory is configured.

A cache memory 1 shown in FIG. 1 is housed in a single chip on a semiconductor substrate. The memory thus constructed comprises an address array 11 as a directory memory, a data array 12 as a data memory, a block replacement control circuit 13 operating on the LRU (least recently used) algorithm, a tag comparator 14, a write buffer 15 which temporarily holds a write address and write data, and a control circuit 16 which controls the above circuits. As shown in FIG. 2, the cache memory 1 is installed between memory bus 21 to which a main memory 3 is connected, and an MPU bus 22.

In this embodiment, there is connected a 32-bit-long full-write register 19 between the data array 12 and an internal data bus 17b via a gate and selector circuit 18.

The address array 11 contains, as a tag, high-order 10-plus bits of the main memory address for each data item in the same column position of the data array 12. An MPU 2 supplies an address AD to the cache memory 1. When a column address part CLM of that address is fed to decoders of the address array 11 and data array 12, the corresponding address tag and data are read simultaneously from the same columns of both arrays. The data array 12 is structured so that four-byte data is read at a time. Once read out, the data is placed temporarily in the full-write register 19.

Meanwhile, the address tag that was read from the address array 11 is supplied to the tag comparator 14. The comparator 14 is also supplied with the data of a tag part TAG of the address AD sent by the MPU 2. The tag from the address array 11 and the data are then compared. A signal CH is output indicating whether the compare operation is a hit (match) or a miss (mismatch).

In the case of a hit, the four-byte data that was read from the corresponding column position in the data array 12 and held in the full-write register 19 is sent to the MPU 2 over the data bus 17b. In the case of a miss, there are connected an internal address bus 17a and the data bus 17b, as well as the MPU bus 22 and the memory bus 21 by way of, but not limited to, an I/O circuit 41. In this state, the MPU 2 gains direct access to the main memory 3 over the memory bus 21. If a miss is recognized during a data write operation, the address and the data held in the write buffer 15 are output onto the memory bus 21.

The write buffer 15 also functions as an address counter that generates a series of addresses needed for block transfer.

The gate and selector circuit 18 works as follows. A byte specification signal called a byte code (BC) is fed to the cache memory 1 from the MPU 2, a control signal is generated by the control circuit 16, and one-byte write data is set to the write buffer 15 during a data write operation. Using the control signal, the gate and selector circuit 18 stores selectively the write data in the full-write register 19 at its position corresponding to the byte code BC. At the same time, with one-word data having been read from the data array 12, the circuit 18 transfers to the full-write buffer 19 three bytes of the one-word data other than those bytes to be written. In addition, the gate and selector circuit 18 is structured so as to transfer the 32-bit data held in the full-write buffer 19 to both the data array 12 and the main memory 3, which is an external memory.

In the system whose configuration is depicted in FIG. 2, the memory buss 21 is connected with a ROM 5 and an I/O register 6, as well as with a video data frame buffer 31, a file controller 32 and a DMA controller 33 via a system adapter 7. A memory control circuit 4 is provided to control the data transfer between cache memory 1 and main memory 3.

In this embodiment, the memory control circuit 4 is equipped with an ECC generator and an ECC checker, both not shown. An ECC code of, say, 4 bits is generated and added to a 32-bit data item supplied from the cache memory 1. The data is stored in the main memory 3 along with the ECC code. When the data is read from the main memory 3, the accompanying ECC code is checked to correct an error bit as needed before the data is handed over to the cache memory 1.

Figure 3:
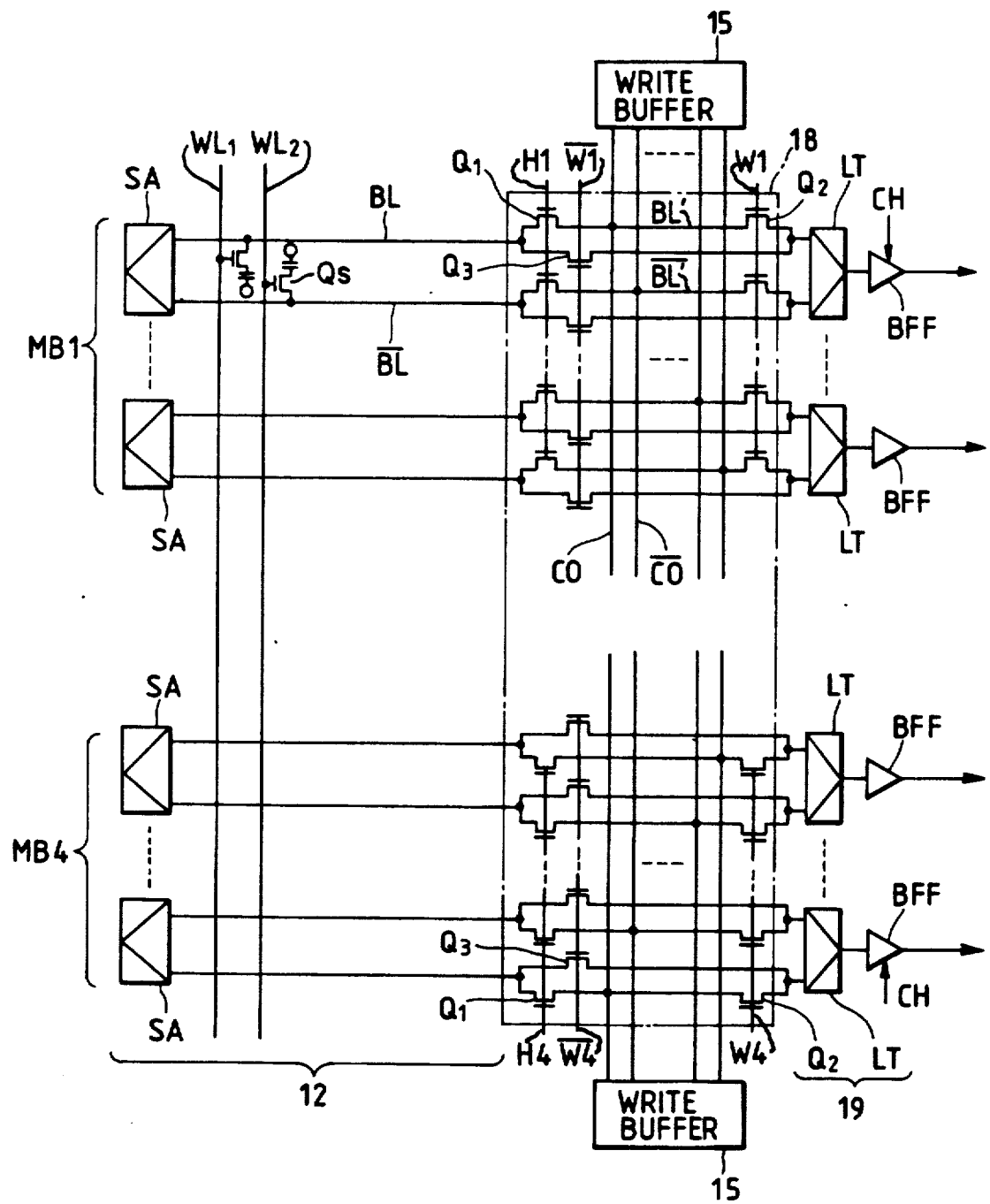
FIG. 3 is a circuit diagram showing how a data array, a gate and selector circuit and a full-write register are arranged in the cache memory according to the invention.

Turning now to FIG. 3, there is shown a typical circuit configuration of the data array 12, gate and selector circuit 18, and full-write register 19 in the cache memory whose block diagram is depicted in FIG. 1.

The data array 12 includes a dynamic RAM comprising single-element memory cells. In this data array, which permits 32-bit parallel data read operations, there are provided 64 memory cell columns. The drain terminal of each of MOS Q's for selecting an odd-numbered column memory cell is connected to a common bit line BL; the drain terminal of each of MOS Q's for selecting an even-numbered column memory cell is connected to a common bit line $\overline{BL}$. A total of 32 sense amplifiers SA are connected between the bit lines BL and $\overline{BL}$. Meanwhile, there are gate terminals for the MOS Q's for selecting an odd-numbered column memory cell out of the 64 memory cells that belong to the same row. These gate terminals are connected to odd-numbered word lines $WL_1$ and so on. The gate terminals for the MOS Q's for selecting an odd-numbered column memory cell are connected to even-numbered word lines $WL_2$ and so on. In this arrangement, when a single word line is brought to the selection level, the MOS Q's 32 memory cells are turned on, causing the corresponding 32 sense amplifiers SA to read out one-word data simultaneously.

Furthermore, each of the 64 bit lines BL and $\overline{BL}$ is divided into two branches. One branch line is connected via two MOS gates $Q_1$ and $Q_2$ to latch circuits LT constituting the full-write register 19. The other branch line is connected via MOS gates $Q_3$ to the same latch circuits LT. The data array 12 is split into four blocks MB1 through MB4 in bytes, i.e., in eight bits. The bit lines belonging to each block are fed with common control signals Hi, Wi and $\overline{Wi}$ (i = 1, 2, 3, 4) for control purposes. Of these signals, Wi and $\overline{Wi}$ are selection signals corresponding to the byte control signal BC, and Hi is a signal equivalent to the logical product of the hit signal CH and the selection signal Wi. The bit lines BL' and $\overline{BL}'$ are connected with complementary output signal lines CO and $\overline{CO}$ of the write buffer 15.

Each of the latch circuits LT is connected with a buffer that outputs latched data onto the data bus 17b shown in FIG. 1. The latch circuits LT may be formed by differential amplifiers similar to the sense amplifiers SA of the data array 12.

There will now be described a partial-write operation to be performed on the data array 12 in this embodiment. When any one byte (8 bits) of 32-bit data is to be updated, the MPU 2 sends a byte control signal BC and eight-bit write data to the cache memory 1. The byte control signal BC is placed in the control circuit 16, while the eight-bit write data is set to predetermined eight buffer elements in the write buffer 15. In accordance with the byte control signal BC, the control circuit 16 brings high only one control signal (Wi), out of the signals $W_1$ through $W_4$ for the MOS gate $Q_2$, in order to select a block that corresponds to the specified byte. This causes the one-byte write data supplied by the MPU 2 to be written to the eight latch circuits LT corresponding to the byte code BC in the full-write register 19.

In the meantime, the data array 12 permits selection of the word line WL corresponding to the same column address CLM as that by which to retrieve the address array 11. In the gate and selector circuit 18, an inverse signal $\overline{Wi}$ of the selection signal Wi turns on the MOS gates $Q_3$ on the block that corresponds to the remaining three bytes to which write data (1 byte long) is not written. This causes the three bytes out of the four read from the data array 12 to be written to unoccupied latch circuits LT in the full-write register 19.

Thereafter, a hit signal CH is output by the tag comparator 14. This brings high a control signal that corresponds to the byte control signal BC. That control signal is selected out of the signals $H_1$ through $H_4$ fed by the control circuit 16 to the MOS gates $Q_1$. Bringing the control signal high turns on the MOS gates $Q_1$ connected to the latch circuits LT in which one-byte write data is held. The write data is then placed onto the bit lines of the data array 12, and is written to the selected memory cell by the sense amplifiers SA. Concurrently, the 32-bit data held by all the latch circuits LT is output to the external memory by buffers BFF via the data bus 17b.

In a write operation other than the partial-write operation described above, the selection signals $W_1$ through $W_4$ fed by the control circuit 16 to the gate and selector circuit 18 are all brought to the selection level. The 32-bit write data held in the write buffer 15 is written to all the latch circuits LT in the full-write register 19. When a hit signal CH is output by the tag comparator 14, the 32 MOS gates $Q_3$ are all turned on. Simultaneously, the one-word data in the full-write register 19 is transferred both to the data array 12 and to the external memory via the buffer BFF.

The first embodiment of the invention described above operates on the so-called write-through method. Under this method, when any data item in the cache memory 1 is updated, the corresponding data item in the main memory 3 is updated simultaneoulsy. The circuitry of this embodiment can also be applied to what is known as a copy-back cache memory. Under the copy-back method, when a block replacement occurs, the main memory is updated accordingly.

As described above, the first embodiment of the invention includes a full-write register which can hold 32 bits of data at a time after a reading from a data array in a cache memory. The full-write register is connected to the data array via gates. A selector is provided between the full-write register on the one hand, and a write buffer holding write data or an internal bus arrangement on the other. The gates and the selector are controlled in response to a byte control signal from a microprocessor unit (MPU). Byte-long write data and the three bytes other than those bytes in the data array which are subject to partial-write operations are placed simultaneously in the full-write register. Then in accordance with a hit signal output by the tag comparator, the updated 32-bit data in the full-write register is at once stored in the data array and transferred to an external memory. In this arrangement, the byte data subject to a partial-write operation can be placed in the full-write register at the same time that data is read from the data array. This means that a partial-write operation may be performed on the data array in two cycles.

It is to be understood by those skilled in the art that the foregoing description is a preferred embodiment of the disclosed device and that various changes and modifications may be made in the invention without departing from the spirit and scope thereof. A modified cache memory arrangement is one in which the 32-bit full-write register of the above-described embodiment may be replaced with a register capable of holding 64-bit or one-block (16-byte) data. Of the data thus held, four bytes are selected by a selector or the like for transfer to the main memory. Needless to say, the configuration of the gate and selector circuit that may be used in an eembodiment is not limited to what is depicted in FIG. 3.

The foregoing description has primarily focused on cache memory applications of the invention. However, the invention is not limited to such applications and may be applied to communication buffer memories, video field memories and other buffer storage apparatus in general.

Figure 4:
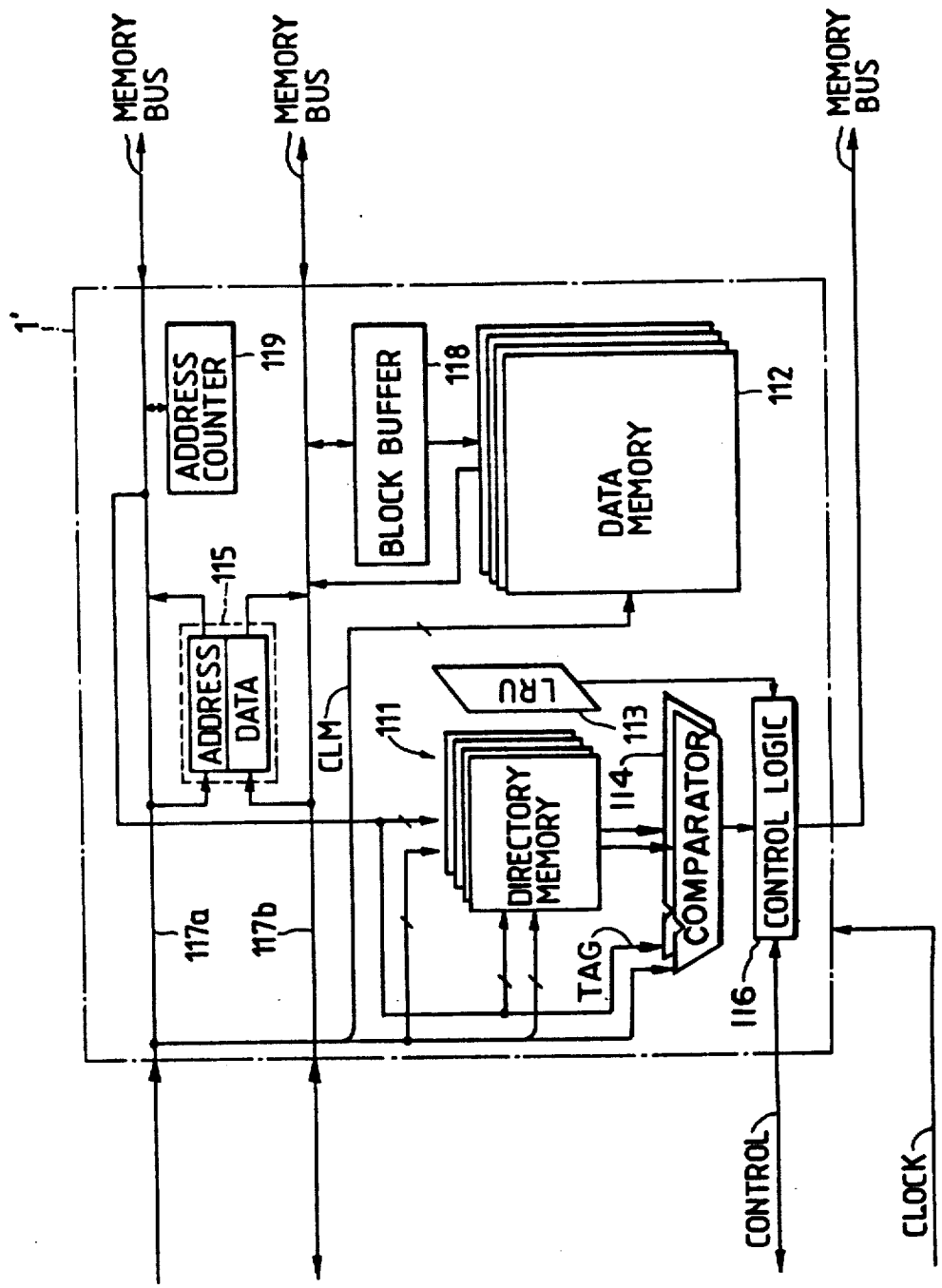
FIG. 4 is a block diagram of a second embodiment of the invention as a cache memory.

Referring now to FIG. 4, there will now be described the second embodiment of the invention as it is applied to a cache memory incorporated in a cache controller. This cache memory can also be used in the microprocessor system shown in FIG. 2.

A cache memory 1' shown in FIG. 4 is housed in a single chip on a semiconductor substrate. The memory thus constructed comprises a directory memory 111, a data memory 112, a block replacement control circuit 113 operating on the LRU (least recently used) algorithm, tag comparators 114, a write buffer 115 which temporarily holds a write address and write data, and a control logic circuit 116 which controls the above circuits.

In the second embodiment, there is provided, between the data memory 112 and an internal data bus 117b, a dualport block buffer 118 capable of accommodating data of, say, 64 bytes per block. The cache memory of this embodiment adopts, but not limited to, the so-called set associative method whereby each block in the main memory is keyed to a plurality of blocks in the cache memory. The directory memory 111 and the data memory 112 are each of a four-way type. There are four tag comparators 114.

The directory memory 111 contains, as a tag, high-order 10-plus bits of the main memory address for each data item in the same column position of the data memory 112. The MPU 2 supplies an address AD to the cache memory 1'. When a column address part CLM of that address is fed to decoders of the directory memory 111 and data memory 112, the corresponding address tag and data are read simultaneously from the same columns of both memories. The data memory 112 is structured so that 16-byte data is read at a time. Once read out, the data is placed temporarily in the block buffer 118. Data transfer between data memory 112 and block buffer 118 is carried out in, but not limited to, 16 bytes.

Meanwhile, the address tag that was read from the directory memory 111 is supplied to the tag comparators 114. The comparators 114 are also supplied with the data of a tag part TAG in the address AD sent by the MPU. The tag from the directory memory 111 and the data are then compared. A signal CH is output indicating whether the compare operation is a hit (match) or a miss (mismatch).

In the case of a hit, the selector selects the one-word (4-byte) data specified by the low-order two bits $A_0$ and $A_1$ of the current address out of the 16-byte data that was held in the block buffer 118 after being read from the corresponding position in the data memory 112. The selected data is supplied to the MPU 2 over the data bus 117b. In the case of a miss, the MPU bus 22 and the memory bus 21 are connected via an internal address bus 117a and the internal data bus 117b. Using the memory bus 21, the MPU 2 gains direct access to the main memory 3. If a miss is recognized during a data write operation, the address that was read from the directory memory 111 is set to an address counter 119. The address is then incremented by a control signal coming from the control logic circuit 116. In this manner, a series of addresses are generated successively to provide for block transfer.

Figure 5:
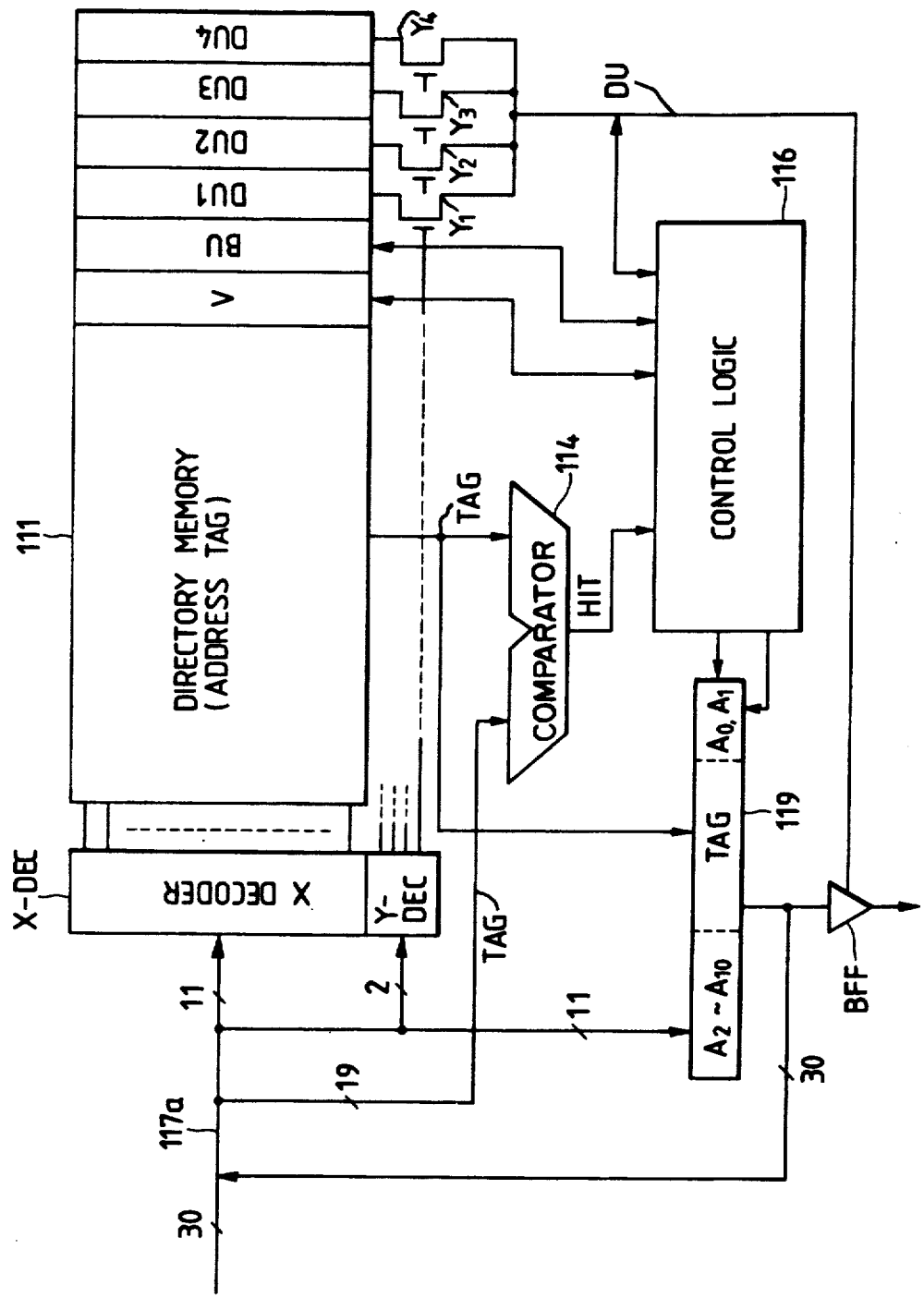
FIG. 5 is a system configuration diagram showing how a microprocessor system is configured using the cache memory of the second embodiment.

As illustrated in FIG. 5, the cache memory of the second embodiment has a valid bit V and a block update bit BU. The valid bit V indicates the validity of a block-length data item in that column position of the data memory which corresponds to each bit per column of the directory memory 111. The block update bit BU indicates whether there is any updated data item in each block. For this cache memory, one block has four words (16 bytes).

The directory memory 111 has data update bits DU1 through DU4. These bits indicate whether there is any updated word in the four words of data in each block.

The flag bit V, BU, and DU1 through DU4 described above are read and supplied to the control logic circuit 116 at the same time that an address tag is read from the directory memory 111 based on the column address part CLM ($A_2$ through $A_{10}$) of an address AD of, say, 30 bits. The address is fed from the outside. The control logic circuit 116 sets the bit V to "1" when one-block data is transferred from the main memory 111 to the data memory 112. If a write operation scores a hit in the cache memory and the corresponding data in the data memory 112 is updated accordingly, then a "1" is set on the bit DU that matches the one word specified by the lowest addresses $A_0$ and $A_1$. Selecting one of the four data update bits DU1 through DU4 is done by having a Y decoder Y-DEC (for decoding addresses $A_0$ and $A_1$) activate one of Y switches $Y_1$ through $Y_4$. As a result, upon data write operation, all the control logic circuit 116 has to do is to generate a write enable signal as well as the write data by which to set the data update bits (DU1-DU4) to "1" each in response to a cache hit signal HIT from the tag comparator 114.

The signals that were read from the data update bits DU1 through DU4 upon read operation go past the Y switches $Y_1$ through $Y_4$ before being OR'ed by a wired OR circuit to generate a logical sum signal DU. The logical sum signal is fed to the control logic circuit 116.

When access to the cache memory is a miss, the block that contains the target data needs to be transferred from the main memory to the cache memory. In such a case, if the block update bit BU is found to be "0," the control logic circuit 116 acts as follows. Without reading (i.e., abandoning) the block that is no longer needed, the circuit 116 latches onto the address counter 119 the address tag that was read from the directory memory 111 and the column address on the bus. By sending a count-up signal, the circuit 116 increments the address counter 119 to output addresses successively. Under the block transfer method, one block of data is transferred from the main memory to the cache memory for temporary storage in the block buffer 118. While the MPU 2 is not accessing the cache memory, the circuit 116 moves the block of data from the block buffer 118 to the data memory 112.

If the block update bit is found to be "1" upon block transfer as a result of a miss in accessing the cache memory, the control logic circuit 116 latches the address tag and the column address onto the address counter 119. Then if any of the data update bits DU1 through DU4 is "0," the circuit 116 counts up the address counter 119 at high speed. If any of the data update bits is "1," the circuit 116 may, say, drive a tri-state buffer BBF to output to the outside the address from inside the address counter 119 and the corresponding data from inside the data memory 112. The address is retained long enough to permit writing to the main memory before the address counter 119 is incremented.

The above-described arrangement provides correspondence in content between main memory and cache memory. Because only the updated data in the cache memory is transferred, with the unchanged data left untouched, the time required for data transfer over the memory bus is substantially less than in conventional devices that transfer the entire block of data. As a result, the system throughput is improved.

It takes the control logic circuit 116 about the same time to judge the data update bits DU1 through DU4 as to increment the address counter 119. Therefore, if all DU bits for the entire block are set to "1" each (i.e., if the same number of data items as for conventional block transfer needs to be transferred), it only takes about the same time to perform the transfer as in conventional block transfer. Thus in this respect as well, there is no disadvantage with the second embodiment of the invention as compared to conventional block transfer arrangements.

The second embodiment described above involves four words constituting a single block. It is to be noted that the number of words per block is not limited to four; it may be 8, 16 or otherwise. All that needs to be done in terms of per-block word count is to provide as many data update bits as required by the number of the words per block. In this embodiment, the block buffer 118 is provided between data array 112 and data bus 117b. In a modification, the block buffer 118 may be omitted. Alternatively, a bit may be provided to indicate if there exists effective data in the block buffer before data transfer occurs from the main memory to the data memory. In this case, a cache hit signal may also be generated so that the target data is read from the block buffer. This arrangement further boosts the processing speed.

As described above, the second embodiment of the invention includes a bit string indicating whether or not any data in the data array has been updated in accordance with the tag in the address array acting as the directory memory. When a miss is recognized in accessing the cache memory and the block determined by the LRU algorithm is to be transferred to the main memory, the bit string is referenced so that only the updated data is transferred. Because each bit in the bit string corresponds to a word and not to a block for updating, the unchanged data need not be output to the outside. This improves the throughput of the memory bus and MPU bus.

It is to be understood by those skilled in the art that the foregoing description is another preferred embodiment of the disclosed device and that various changes and modifications may be made in the invention without departing from the spirit and scope thereof. For example, the four-way type set associative cache memory adopted in the second embodiment may be replaced with a two-way type, five-way type or one that involves more than five ways. The invention can also be applied to a direct mapping cache memory.

The foregoing description has primarily focused on cache memory applications of the invention. However, the invention is not limited to such applications and may be applied to communication buffer memories, video field memories and other buffer storage apparatus in general.

What is claimed is:

1. A single semiconductor chip cache buffer storage device comprising:
   directory memory means for storing an address tag, said directory memory means being integrally formed on a common substrate;
   data memory means for storing first data which corresponds to said address tag stored in said directory memory means, said data memory means being integrally formed on said common substrate;
   buffer register means for holding second data, said buffer register means being integrally formed on said common substrate; and,
   selector means, electrically connected between said data memory means and said buffer register means and integrally formed on said common substrate, for selectively transferring a part of said first data from said data memory means to said buffer register means, said selector means comprising data replacement means for replacing a preselected portion of the first data from said data memory means with replacement data for transfer to said buffer register means.

2. The buffer storage device according to claim 1, wherein said data memory means includes a plurality of data lines each of which is coupled to a plurality of memory cells, and wherein said selector means includes write means for forming said replacement data and first switching means coupled between said write means and said plurality of data lines for selectively providing said replacement data to predetermined data lines of said plurality of data lines.

3. The buffer storage device according to claim 2, wherein said selector means includes second switching means coupled between said write means and said buffer register means for providing said replacement data to a preselected portion of said buffer register means.

4. The buffer storage device according to claim 3, wherein said selector means includes third switching means coupled between said plurality of data lines and said buffer register means for providing said part of said first data from said memory means to said buffer register means.

5. The buffer storage device according to claim 4, wherein each of said memory cells is a dynamic type memory cell.

6. The buffer storage device according to claim 5, further comprising internal data bus means for transferring said part of said first data and said replacement data, held in said buffer register means as said second data, simultaneously to an associated peripheral apparatus outside said buffer storage device.

7. The buffer storage device according to claim 2, wherein each of said memory cells is a dynamic type memory cell.

8. The buffer storage device according to claim 1, further comprising internal data bus means for transferring said part of said first data and the replacement data held in said buffer register means simultaneously to an associated peripheral apparatus outside said buffer storage device.

* * * * *